(12) United States Patent
Lee et al.

(10) Patent No.: US 12,239,019 B2
(45) Date of Patent: Feb. 25, 2025

(54) THERMOELECTRIC DEVICE

(71) Applicant: LG INNOTEK CO., LTD., Seoul (KR)

(72) Inventors: Seung Hwan Lee, Seoul (KR); Tae Su Yang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 9 days.

(21) Appl. No.: 17/757,920

(22) PCT Filed: Dec. 16, 2020

(86) PCT No.: PCT/KR2020/018416
§ 371 (c)(1),
(2) Date: Jun. 23, 2022

(87) PCT Pub. No.: WO2021/132974
PCT Pub. Date: Jul. 1, 2021

(65) Prior Publication Data
US 2023/0041393 A1    Feb. 9, 2023

(30) Foreign Application Priority Data
Dec. 24, 2019  (KR) ........................ 10-2019-0173753

(51) Int. Cl.
*H10N 10/17* (2023.01)
*H10N 10/01* (2023.01)
*H10N 10/855* (2023.01)

(52) U.S. Cl.
CPC ............. *H10N 10/17* (2023.02); *H10N 10/01* (2023.02); *H10N 10/855* (2023.02)

(58) Field of Classification Search
CPC ........ H10N 10/80; H10N 10/81; H10N 10/01; H10N 10/855
See application file for complete search history.

(56) References Cited

U.S. PATENT DOCUMENTS

| 2003/0156375 A1* | 8/2003 | Grigorov | ............ H01L 23/552 257/E23.114 |
| 2009/0084423 A1* | 4/2009 | Horio | .................... H01L 23/145 136/241 |

(Continued)

FOREIGN PATENT DOCUMENTS

| JP | 2008-277584 A | 11/2008 |
| JP | 2009-260173 A | 11/2009 |

(Continued)

OTHER PUBLICATIONS

International Search Report dated Mar. 16, 2021 in International Application No. PCT/KR2020/018416.

(Continued)

*Primary Examiner* — Daniel P Malley, Jr.
(74) *Attorney, Agent, or Firm* — Saliwanchik, Lloyd & Eisenschenk

(57) ABSTRACT

A thermoelectric element according to one embodiment of the present disclosure includes a first substrate, a first buffer layer disposed on the first substrate, a first electrode disposed on the first buffer layer, a P-type thermoelectric leg and an N-type thermoelectric leg disposed on the first electrode, a second electrode disposed on the P-type thermoelectric leg and the N-type thermoelectric leg, a second buffer layer disposed on the second electrode, and a second substrate disposed on the second buffer layer, wherein at least one of the first buffer layer and the second buffer layer includes a silicone resin and an inorganic material, and the Young's modulus of at least one of the first buffer layer and the second buffer layer is 1 to 65 MPa.

12 Claims, 6 Drawing Sheets

(56) References Cited

U.S. PATENT DOCUMENTS

| | | | |
|---|---|---|---|
| 2012/0211044 A1 | 8/2012 | Kurihara et al. | |
| 2013/0276850 A1 | 10/2013 | Crispin et al. | |
| 2015/0179912 A1* | 6/2015 | Maeshima | H10N 10/17 |
| | | | 136/211 |
| 2016/0141479 A1 | 5/2016 | Matsunami et al. | |
| 2018/0014431 A1* | 1/2018 | Xu | H05K 7/20 |
| 2020/0136005 A1* | 4/2020 | Sun | H10N 10/01 |

FOREIGN PATENT DOCUMENTS

| | | | | |
|---|---|---|---|---|
| JP | 2015-15407 A | 1/2015 | | |
| JP | 2017-59698 A | 3/2017 | | |
| KR | 10-2019-0003028 A | 1/2019 | | |
| KR | 10-2019-0090523 A | 8/2019 | | |
| KR | 10-2020155 B1 | 9/2019 | | |
| TW | 201611262 A | 3/2016 | | |
| WO | WO-2013011997 A1 * | 1/2013 | | H01L 35/22 |
| WO | 2019/082932 A1 | 5/2019 | | |

OTHER PUBLICATIONS

Supplementary European Search Report dated Nov. 27, 2023 in European Application No. 20907116.6.
Office Action dated Jan. 4, 2024 in Korean Application No. 10-2019-0173753.
Office Action dated Jun. 6, 2024 in Taiwanese Application No. 109144912.

* cited by examiner

THERMOELECTRIC DEVICE

CROSS-REFERENCE TO RELATED APPLICATIONS

This application is the U.S. national stage application of International Patent Application No. PCT/KR2020/018416, filed Dec. 16, 2020, which claims the benefit under 35 U.S.C. § 119 of Korean Application No. 10-2019-0173753, filed Dec. 24, 2019, the disclosures of each of which are incorporated herein by reference in their entirety.

TECHNICAL FIELD

The present disclosure relates to a thermoelectric element, and more specifically, to a structure between a substrate and an electrode of a thermoelectric element.

BACKGROUND ART

A thermoelectric phenomenon is a phenomenon which occurs due to movement of electrons and holes in a material and refers to direct energy conversion between heat and electricity.

A thermoelectric element is a generic term for a device using the thermoelectric phenomenon and has a structure in which a P-type thermoelectric material and an N-type thermoelectric material are joined between metal electrodes to form a PN junction pair.

Thermoelectric elements can be classified into a device using temperature changes of electrical resistance, a device using the Seebeck effect, which is a phenomenon in which an electromotive force is generated due to a temperature difference, a device using the Peltier effect, which is a phenomenon in which heat absorption or heat generation by current occurs, and the like. The thermoelectric element is variously applied to home appliances, electronic components, communication components, or the like. For example, the thermoelectric element can be applied to a cooling device, a heating device, a power generation device, or the like. Accordingly, the demand for thermoelectric performance of the thermoelectric element is increasing more and more.

The thermoelectric element includes substrates, electrodes, and thermoelectric legs, a plurality of thermoelectric legs are arranged in an array shape between an upper substrate and a lower substrate, a plurality of upper electrodes are arranged between the plurality of thermoelectric legs and the upper substrate, and a plurality of lower electrodes are arranged between the plurality of thermoelectric legs and the lower substrate. In this case, one of the upper substrate and the lower substrate can be a low-temperature part, and the other can be a high-temperature part.

Meanwhile, when the thermoelectric element is applied to an apparatus for power generation, power generation performance increases as a temperature difference between the low-temperature part and the high-temperature part increases. For example, the temperature of the high-temperature part can rise to 200° C. or higher. When the temperature of the high-temperature part is 200° C. or higher, thermal stress is applied to the substrate at the high-temperature part side due to a difference in coefficient of thermal expansion between the substrate at the high-temperature part side and the electrode and thus an electrode structure can be destroyed. When the electrode structure is destroyed, a crack can be applied to a bonding surface between a solder arranged on the electrode and the thermoelectric leg and can lower the reliability of the thermoelectric element.

Meanwhile, in order to enhance the heat transfer performance of the thermoelectric element, attempts to use metal substrates are increasing.

Generally, the thermoelectric element can be manufactured according to a process of sequentially laminating electrodes and thermoelectric legs on a metal substrate which is prepared in advance. When the metal substrate is used, an advantageous effect can be obtained in terms of heat conduction, but there is a problem in that reliability is lowered when used for a long time due to a low withstand voltage.

Accordingly, there is a need for a thermoelectric element of which not only heat conduction performance, but also withstand voltage performance and thermal stress relaxation performance are improved.

DISCLOSURE

Technical Problem

The present disclosure is directed to providing a buffer layer of a thermoelectric element of which all of heat conduction performance, withstand voltage performance, and thermal stress relaxation performance are improved.

Technical Solution

According to an aspect of the present disclosure, there is provided a thermoelectric element including a first substrate, a first buffer layer disposed on the first substrate, a first electrode disposed on the first buffer layer, a P-type thermoelectric leg and an N-type thermoelectric leg disposed on the first electrode, a second electrode disposed on the P-type thermoelectric leg and the N-type thermoelectric leg, a second buffer layer disposed on the second electrode, and a second substrate disposed on the second buffer layer, wherein at least one of the first buffer layer and the second buffer layer includes a silicone resin and an inorganic material, and the Young's modulus of at least one of the first buffer layer and the second buffer layer is 1 to 65 MPa.

A reference temperature at which the Young's modulus is defined may be a temperature between 150° C. and 200° C.

The silicone resin may include polydimethylsiloxane (PDMS), and the inorganic material may be included in an amount of 85 to 90 wt % of at least one of the first buffer layer and the second buffer layer.

The inorganic material may include a first inorganic material group in which D50 is 5 to 20 μm, a second inorganic material group in which D50 is 20 to 30 μm, and a third inorganic material group in which D50 is 30 to 40 μm.

A temperature at the first substrate may be lower than a temperature at the second substrate.

The Young's modulus of the second buffer layer may be 1 to 65 MPa.

The first substrate may be an aluminum substrate, and the second substrate may be a copper substrate.

The thermoelectric element may further include a first insulating layer disposed between the first substrate and the first buffer layer.

The first insulating layer may include aluminum oxide.

The first insulating layer may be further disposed on at least one of a surface opposite a surface facing the second substrate among both surfaces of the first substrate and a side surface of the first substrate.

The first insulating layer may be a composite layer formed of a composite including silicon and aluminum.

The thermoelectric element may further include a second insulating layer disposed between the second buffer layer and the second substrate, wherein the second insulating layer may be selected from an aluminum oxide layer, the composite layer formed of a composite including silicon and aluminum, and a resin layer formed of a resin composition including at least one of an epoxy resin and a silicone resin and an inorganic material.

The thermoelectric element may further include a heat sink disposed on the second substrate.

A thickness of the second buffer layer may be larger than a thickness of the first buffer layer.

A change rate of the Young's modulus of the first buffer layer for 500 hours at 150° C. to 200° C. may be within 10%.

According to another aspect of the present disclosure, there is provided a power generation system including the thermoelectric element according to one embodiment of the present disclosure, a first fluid flowing toward the first substrate of the thermoelectric element, and a second fluid flowing toward the second substrate of the thermoelectric element and having a temperature 95° C. to 185° C. higher than a temperature of the first fluid, wherein a resistance change rate of the thermoelectric element is within 7% for 500 hours.

Advantageous Effects

According to an embodiment of the present disclosure, a thermoelectric element of which performance is excellent and reliability is high can be obtained. Specifically, according to the embodiment of the present disclosure, a thermoelectric element of which not only heat conduction performance, but also withstand voltage performance and thermal stress relaxation performance are improved can be obtained.

The thermoelectric element according to the embodiment of the present disclosure can be applied not only to an application implemented in a small size but also to an application implemented in a large size such as a vehicle, a ship, a steel mill, an incinerator, or the like.

MODE FOR INVENTION

Hereinafter, preferable embodiments of the present disclosure will be described in detail with reference to the accompanying drawings.

However, the technical spirit of the present disclosure is not limited to some embodiments which will be described and may be embodied in various forms, and one or more elements in the embodiments may be selectively combined and replaced to be used within the scope of the technical spirit of the present disclosure.

Further, terms used in the embodiments of the present disclosure (including technical and scientific terms), may be interpreted with meanings that are generally understood by those skilled in the art unless particularly defined and described, and terms which are generally used, such as terms defined in a dictionary, may be understood in consideration of their contextual meanings in the related art.

In addition, terms used in the description are provided not to limit the present disclosure but to describe the embodiments.

In the specification, the singular form may also include the plural form unless the context clearly indicates otherwise and may include one or more of all possible combinations of A, B, and C when disclosed as at least one (or one or more) of "A, B, and C".

In addition, terms such as first, second, A, B, (a), (b), and the like may be used to describe elements of the embodiments of the present disclosure.

The terms are only provided to distinguish the elements from other elements, and the essence, sequence, order, or the like of the elements are not limited by the terms.

Further, when particular elements are disclosed as being "connected," "coupled," or "linked" to other elements, the elements may include not only a case of being directly connected, coupled, or linked to other elements but also a case of being connected, coupled, or linked to other elements by elements between the elements and other elements.

In addition, when one element is disclosed as being formed "on or under" another element, the term "on or under" includes both a case in which the two elements are in direct contact with each other and a case in which at least another element is disposed between the two elements (indirectly). Further, when the term "on or under" is expressed, a meaning of not only an upward direction but also a downward direction may be included with respect to one element.

Figure 1:
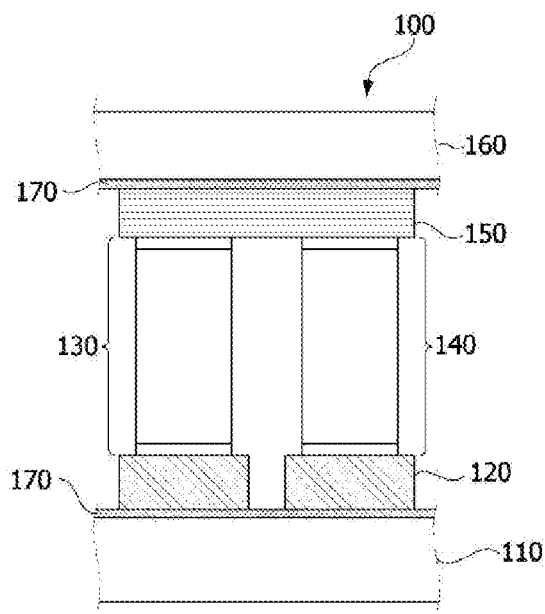
FIG. 1 is a cross-sectional view of a thermoelectric element.
Figure 2:
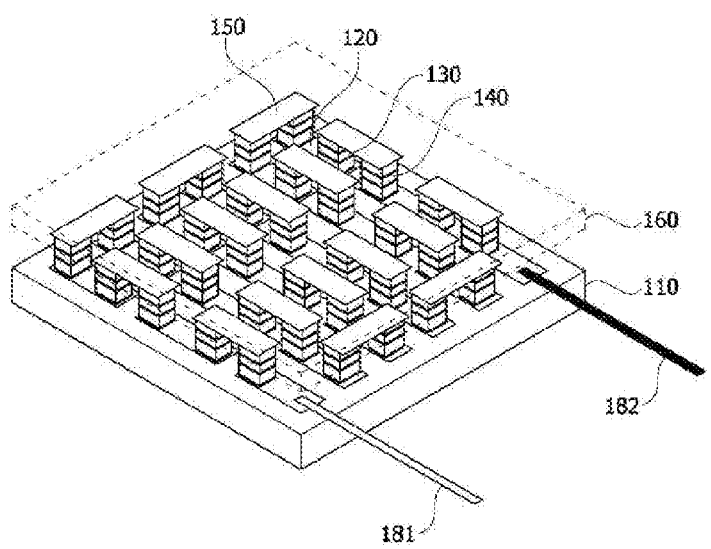
FIG. 2 is a perspective view of the thermoelectric element.
Figure 3:
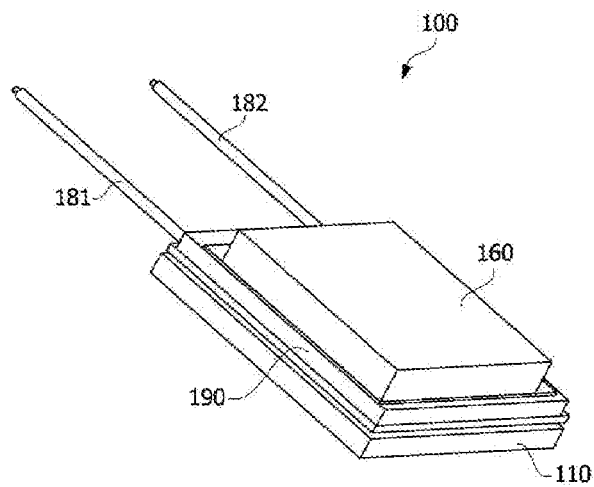
FIG. 3 is a perspective view of the thermoelectric element including a sealing member.
Figure 4:
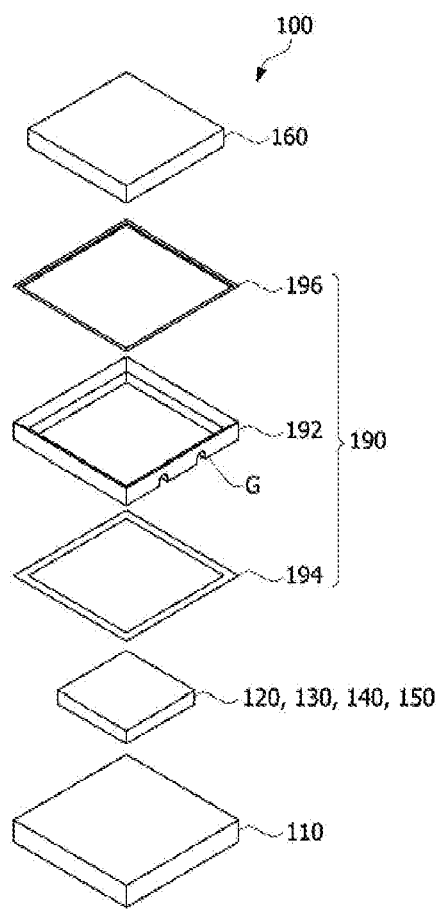
FIG. 4 is an exploded perspective view of the thermoelectric element including the sealing member.

FIG. 1 is a cross-sectional view of a thermoelectric element, FIG. 2 is a perspective view of the thermoelectric element, FIG. 3 is a perspective view of the thermoelectric element including a sealing member, and FIG. 4 is an exploded perspective view of the thermoelectric element including the sealing member.

Referring to FIGS. 1 and 2, a thermoelectric element 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower surfaces of the P-type thermoelectric legs 130 and the N-type thermoelectric legs 140, and the upper electrodes 150 are disposed between the upper substrate 160 and upper surfaces of the P-type thermoelectric legs 130 and the N-type thermoelectric legs 140. Accordingly, the plurality of P-type thermoelectric legs 130 and the plurality of N-type thermoelectric legs 140 are electrically connected by the lower electrodes 120 and the upper electrodes 150. One pair of the P-type thermoelectric leg 130 and the N-type thermoelectric leg 140 which are disposed between the lower electrode 120 and the upper electrode 150 and electrically connected to each other may form a unit cell.

For example, when a voltage is applied to the lower electrode 120 and the upper electrode 150 through lead lines 181 and 182, a substrate through which a current flows from the P-type thermoelectric legs 130 to the N-type thermoelectric legs 140 due to the Peltier effect may absorb heat to function as a cooling part, and a substrate through which a current flows from the N-type thermoelectric legs 140 to the P-type thermoelectric legs 130 may be heated to function as a heating part. Alternatively, when a temperature difference between the lower electrode 120 and the upper electrode 150 is applied, charges in the P-type thermoelectric legs 130 and the N-type thermoelectric legs 140 move due to the Seebeck effect, and thus electricity may be generated.

Here, the P-type thermoelectric legs 130 and the N-type thermoelectric legs 140 may be bismuth telluride (Bi—Te)-based thermoelectric legs including bismuth (Bi) and tellurium (Te) as main raw materials. The P-type thermoelectric legs 130 may be bismuth telluride (Bi—Te)-based thermoelectric legs including at least one among antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include Bi—Sb—Te which is a main raw material in an amount of 99 to 99.999 wt % and may include at least one among nickel (Ni), aluminum (Al), copper (Cu), silver (Ag), lead (Pb), boron (B), gallium (Ga), and indium (In) in an amount of 0.001 to 1 wt % based on the total weight of 100 wt %. The N-type thermoelectric leg 140 may be bismuth telluride (Bi—Te)-based thermoelectric legs including at least one among selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may include Bi—Se—Te which is a main raw material in an amount of 99 to 99.999 wt % and may include at least one among nickel (Ni), aluminum (Al), copper (Cu), silver (Ag), lead (Pb), boron (B), gallium (Ga), and indium (In) in an amount of 0.001 to 1 wt % based on the total weight of 100 wt %.

The P-type thermoelectric legs 130 and the N-type thermoelectric legs 140 may be formed in a bulk type or a stacked type. Generally, the bulk type P-type thermoelectric legs 130 or the bulk type N-type thermoelectric legs 140 may be obtained through a process of producing an ingot by heat-treating a thermoelectric material, pulverizing and sieving the ingot to obtain powder for thermoelectric legs, sintering the powder, and cutting the sintered object. In this case, the P-type thermoelectric legs 130 and the N-type thermoelectric legs 140 may be polycrystalline thermoelectric legs. For the polycrystalline thermoelectric legs, the powder for thermoelectric legs may be compressed at 100 to 200 MPa when sintered. For example, when the P-type thermoelectric legs 130 are sintered, the powder for thermoelectric legs may be sintered at 100 to 150 MPa, preferably, 110 to 140 MPa, and more preferably, 120 to 130 MPa. Further, when the N-type thermoelectric legs 140 are sintered, the powder for thermoelectric legs may be compressed at 150 to 200 MPa, preferably, 160 to 195 MPa, and more preferably, 170 to 190 MPa. Like the above, when the P-type thermoelectric legs 130 and the N-type thermoelectric legs 140 are the polycrystalline thermoelectric legs, strength of the P-type thermoelectric legs 130 and the N-type thermoelectric legs 140 may increase. The stacked type P-type thermoelectric legs 130 or the stacked type N-type thermoelectric legs 140 may be obtained through a process of forming a unit member by coating a paste including a thermoelectric material on a sheet-shaped base material, and then stacking and cutting the unit member.

In this case, one pair of the P-type thermoelectric leg 130 and the N-type thermoelectric leg 140 may have the same shape and volume or may have different shapes and volumes. For example, since electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

In this case, the P-type thermoelectric leg 130 or the N-type thermoelectric leg 140 may have a cylindrical shape, a polygonal pillar shape, an oval pillar shape, and the like.

Alternatively, the P-type thermoelectric leg 130 or the N-type thermoelectric leg 140 may have a stacked structure. For example, the P-type thermoelectric leg 130 or the N-type thermoelectric leg 140 may be formed using a method of stacking a plurality of structures on which a semiconductor material is coated on a sheet-shaped base material, and then cutting the structures. Accordingly, material loss may be prevented and electrical conduction characteristics may be improved. Each structure may include a conductive layer having an opening pattern, and accordingly, it is possible to increase an adhesion force between the structures, lower thermal conductivity, and increase electrical conductivity.

Alternatively, the P-type thermoelectric leg 130 or the N-type thermoelectric leg 140 may be formed to have different cross-sections in one thermoelectric leg. For example, in the one thermoelectric leg, cross-sections of both end portions disposed to face the electrodes may be formed larger than a cross-section between both end portions. Accordingly, since a temperature difference between both end portions may be formed to be large, thermoelectric efficiency may increase.

The performance of the thermoelectric element according to one embodiment of the present disclosure may be expressed as a thermoelectric performance index (a figure of merit, ZT). The thermoelectric performance index (ZT) may be expressed as in Equation 1.

$$ZT = \alpha^2 \cdot \sigma \cdot T/k \qquad \text{Equation 1}$$

Here, $\alpha$ is the Seebeck coefficient [V/K], $\sigma$ is electrical conductivity [S/m], and $\alpha^2\sigma$ is a power factor (W/mK$^2$]). Further, T is a temperature, and k is thermal conductivity [W/mK]. k may be expressed as a·cp·ρ, wherein a is thermal diffusivity [cm$^2$/S], cp is specific heat [J/gK], and ρ is density [g/cm$^3$].

In order to obtain the thermoelectric performance index of the thermoelectric element, a Z value (V/K) is measured using a Z meter, and the thermoelectric performance index (ZT) may be calculated using the measured Z value.

Here, the lower electrodes 120 disposed between the lower substrate 110 and the P-type thermoelectric legs 130 and the N-type thermoelectric legs 140, and the upper electrodes 150 disposed between the upper substrate 160 and the P-type thermoelectric legs 130 and the N-type thermoelectric legs 140 may each include at least one of copper (Cu), silver (Ag), aluminum (Al), and nickel (Ni) and each have a thickness of 0.01 mm to 0.3 mm. When the thickness of the lower electrode 120 or the upper electrode 150 is smaller than 0.01 mm, a function as an electrode may be degraded and thus electrical conduction performance may be lowered, and when the thickness of the lower electrode 120 or the upper electrode 150 is greater than 0.3 mm, conduction efficiency may be lowered due to an increase in resistance.

Further, the lower substrate 110 and the upper substrate 160 facing each other may be metal substrates, and the thicknesses thereof may be 0.1 mm to 1.5 mm. When the thickness of the metal substrate is smaller than 0.1 mm or greater than 1.5 mm, since heat dissipation characteristics or thermal conductivity may be excessively high, reliability of the thermoelectric element may be degraded. Further, when the lower substrate 110 and the upper substrate 160 are the metal substrates, insulating layers 170 may be further formed between the lower substrate 110 and the lower electrodes 120 and between the upper substrate 160 and the upper electrodes 150, respectively. Each of the insulating layers 170 may include a material having thermal conductivity of 1 to 20 W/mK.

In this case, the lower substrate 110 and the upper substrate 160 may have different sizes. For example, a volume, a thickness, or an area of one of the first lower substrate 110 and the upper substrate 160 may be formed larger than a volume, a thickness, or an area of the other one. Accordingly, it is possible to increase the heat absorption performance or heat dissipation performance of the thermoelectric element. Preferably, the volume, thickness, or area of the lower substrate 110 may be formed to be larger than at least one of the volume, thickness, and area of the upper substrate 160. In this case, when disposed in a high-temperature region for the Seebeck effect or applied as a heating region for the Peltier effect, or when a sealing member for protection from an external environment of a thermoelectric module which will be described later is disposed on the lower substrate 110, the lower substrate 110 may be formed to have at least one of the volume, thickness, and area larger than that of the upper substrate 160. In this case, the area of the lower substrate 110 may be formed in a range of 1.2 to 5 times the area of the upper substrate 160. When the area of the lower substrate 110 is less than 1.2 times that of the upper substrate 160, an effect on enhancement of heat transfer efficiency is not high, and when the area of the lower substrate 110 exceeds 5 times that of the upper substrate 160, the heat transfer efficiency is significantly lowered, and a basic shape of the thermoelectric module may be difficult to maintain.

Further, a heat dissipation pattern, for example, an uneven pattern, may be formed on a surface of at least one of the lower substrate 110 and the upper substrate 160. Accordingly, the heat dissipation performance of the thermoelectric element may be increased. When the uneven pattern is formed on a surface which comes into contact with the P-type thermoelectric leg 130 or the N-type thermoelectric leg 140, a bonding characteristic between the thermoelectric leg and the substrate may also be enhanced. The thermoelectric element 100 includes the lower substrate 110, the lower electrodes 120, the P-type thermoelectric legs 130, the N-type thermoelectric legs 140, the upper electrodes 150, and the upper substrate 160.

As shown in FIGS. 3 and 4, sealing members 190 may be further disposed between the lower substrate 110 and the upper substrate 160. The sealing members may be disposed on side surfaces of the lower electrodes 120, the P-type thermoelectric leg 130, the N-type thermoelectric leg 140, and the upper electrode 150 between the lower substrate 110 and the upper substrate 160. Accordingly, the lower electrodes 120, the P-type thermoelectric leg 130, the N-type thermoelectric leg 140, and the upper electrode 150 may be sealed from external moisture, heat, contamination, and the like. Here, the sealing member 190 may include a sealing case 192 disposed to be spaced a predetermined distance apart from side surfaces of the outermost portion of the plurality of lower electrodes 120, the outermost portion of the plurality of P-type thermoelectric legs 130 and the plurality of N-type thermoelectric legs 140, and the outermost portion of the plurality of upper electrodes 150, a sealing material 194 disposed between the sealing case 192 and the lower substrate 110, and a sealing material 196 disposed between the sealing case 192 and the upper substrate 160. Like the above, the sealing case 192 may come into contact with the lower substrate 110 and the upper substrate 160 through the sealing materials 194 and 196. Accordingly, when the sealing case 192 comes into direct contact with the lower substrate 110 and the upper substrate 160, heat conduction occurs through the sealing case 192, and thus, a problem in that the temperature difference between the lower substrate 110 and the upper substrate 160 is lowered may be prevented. Here, the sealing materials 194 and 196 may include at least one of an epoxy resin and a silicone resin, or a tape of which both surfaces are coated with at least one of the epoxy resin and the silicone resin. The sealing materials 194 and 194 may serve to airtightly seal between the sealing case 192 and the lower substrate 110 and between the sealing case 192 and the upper substrate 160, may increase a sealing effect of the lower electrodes 120 and the P-type thermoelectric leg 130, and the N-type thermoelectric leg 140 and the upper electrode 150, and may be interchanged with a finishing material, a finishing layer, a waterproofing material, a waterproofing layer, and the like. Here, the sealing material 194 which seals between the sealing case 192 and the lower substrate 110 may be disposed on an upper surface of the lower substrate 110, and the sealing material 196 which seals between the sealing case 192 and the upper substrate 160 may be disposed on a side surface of the upper substrate 160. To this end, the area of the lower substrate 110 may be larger than the area of the upper substrate 160. Meanwhile, a guide groove G, which withdraws lead lines 180 and 182 connected to the electrodes, may be formed in the sealing case 192. To this end, the sealing case 192 may be an injection-molded product formed of plastic or the like and may be interchanged with a sealing cover. However, the above description of the sealing member is only an example, and the sealing member may be modified into various forms. Although not shown, a heat insulating material may be further included to surround the sealing member. Alternatively, the sealing member may include a heat insulating component.

In the above, the terms "lower substrate 110, lower electrodes 120, upper electrode 150, and upper substrate 160" are used but are only arbitrarily referred to as upper and lower portions for ease of understanding and convenience of description, and positions may be reversed so that the lower substrate 110 and the lower electrodes 120 may be disposed at an upper side, and the upper electrode 150 and the upper substrate 160 may be disposed at a lower side.

Figure 5:
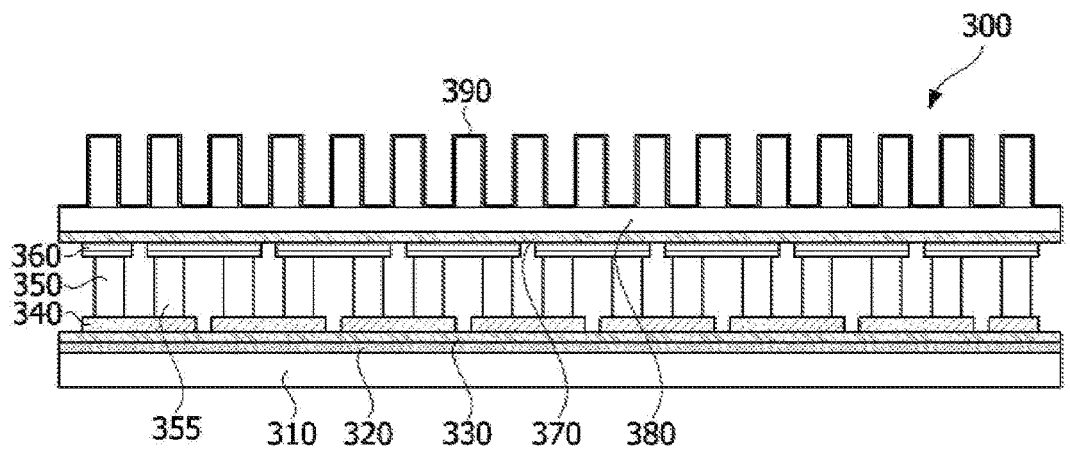
FIG. 5 is a cross-sectional view of a thermoelectric element according to one embodiment of the present disclosure.
Figure 6:
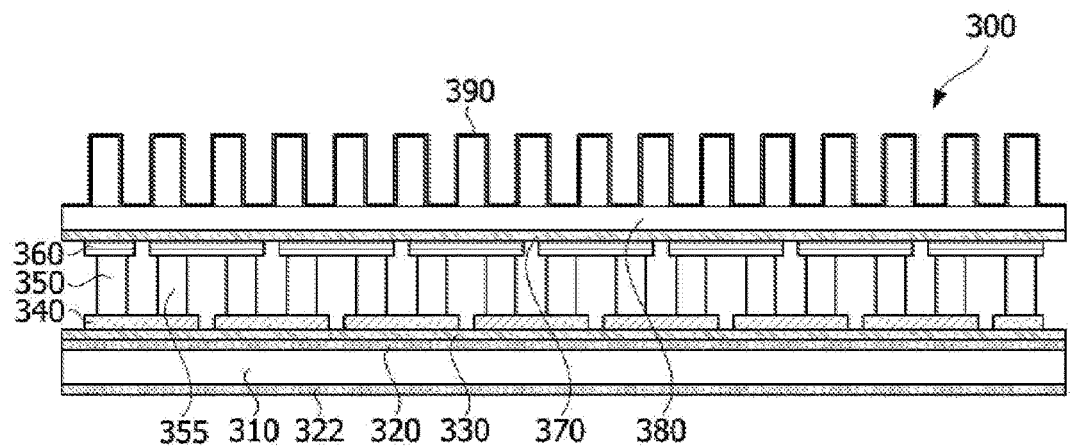
FIG. 6 is a cross-sectional view of a thermoelectric element according to another embodiment of the present disclosure.
Figure 7:
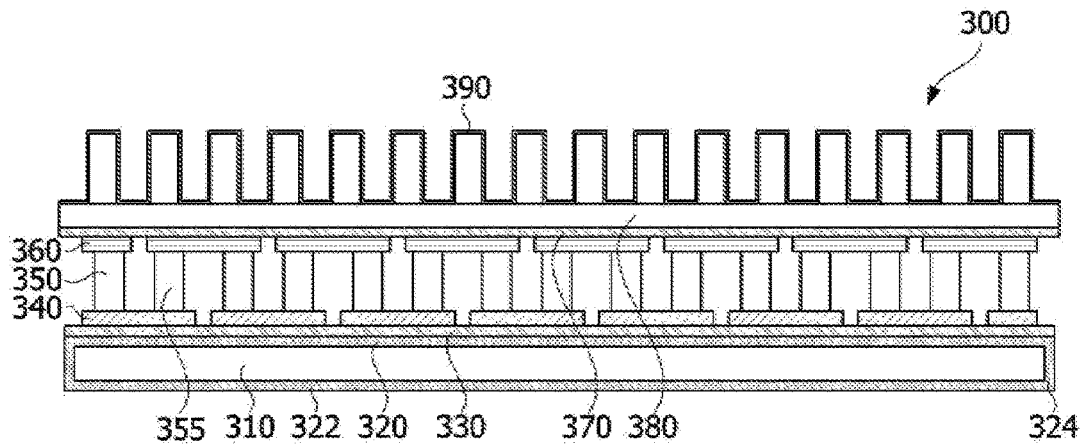
FIG. 7 is a cross-sectional view of a thermoelectric element according to still another embodiment of the present disclosure.
Figure 8:
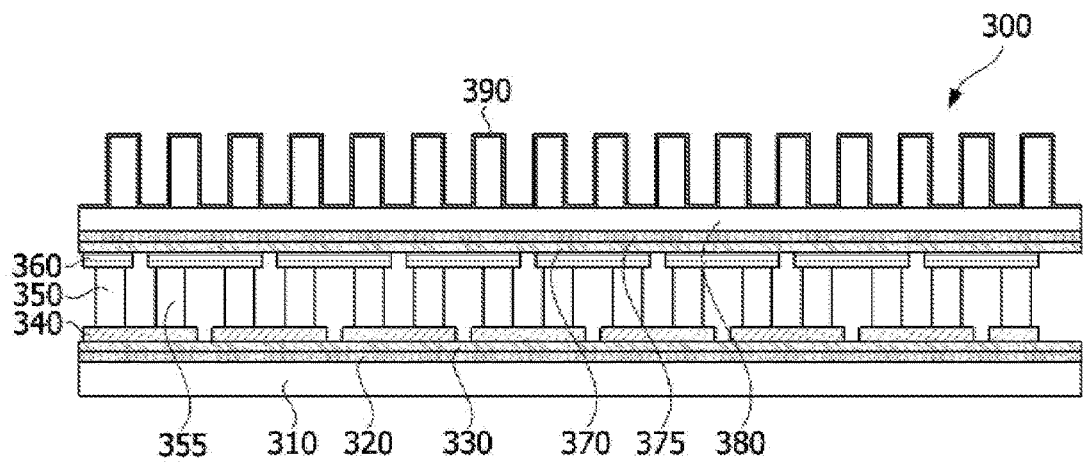
FIG. 8 is a cross-sectional view of a thermoelectric element according to yet another embodiment of the present disclosure.

FIG. 5 is a cross-sectional view of a thermoelectric element according to one embodiment of the present disclosure, FIG. 6 is a cross-sectional view of a thermoelectric element according to another embodiment of the present disclosure, FIG. 7 is a cross-sectional view of a thermoelectric element according to still another embodiment of the present disclosure, and FIG. 8 is a cross-sectional view of a thermoelectric element according to yet another embodiment of the present disclosure. Overlapping descriptions of contents which are the same as the contents described in FIGS. 1 to 4 will be omitted.

Referring to FIGS. 5 to 8, a thermoelectric element 300 according to the embodiment of the present disclosure includes a first substrate 310, a first insulating layer 320 disposed on the first substrate 310, a first buffer layer 330 disposed on the first insulating layer 320, a plurality of first electrodes 340 disposed on the first buffer layer 330, a plurality of P-type thermoelectric legs 350 and a plurality of N-type thermoelectric legs 355 disposed on the plurality of first electrodes 340, a plurality of second electrodes 360 disposed on the plurality of P-type thermoelectric leg 350 and the plurality of N-type thermoelectric leg 355, a second buffer layer 370 disposed on the plurality of second electrodes 360, and a second substrate 380 disposed on the second buffer layer 370.

As shown in the drawings, a heat sink 390 may be further disposed on the second substrate 380. Although not shown, a sealing member may be further disposed between the first substrate 310 and the second substrate 380.

Generally, when the thermoelectric element 300 is driven, the high-temperature part side of the thermoelectric element 300 may be exposed to a high temperature, and due to different coefficients of thermal expansion of the electrode and the substrate, shear stress may be transmitted to an interface between the electrode and the substrate. In the specification, the shear stress transferred to the interface between the electrode and the substrate due to different coefficients of thermal expansion between the electrode and the substrate is referred to as thermal stress. When the thermal stress exceeds a predetermined level, cracks may be applied to a bonding surface between a solder disposed on the electrode and the thermoelectric leg, and the crack may degrade performance of the thermoelectric element and lower reliability. Specifically, when the heat sink is further disposed on the substrate at the high-temperature part side of the thermoelectric element 300, a difference in coefficient of thermal expansion between the substrate and the heat sink may have great influence on the durability and reliability of the thermoelectric element 300.

According to the embodiment of the present disclosure, the first buffer layer 330 and the second buffer layer 370 which relieve the thermal stress due to a difference in coefficient of thermal expansion between the electrode and the substrate may be respectively disposed between the first substrate 310 and the first electrodes 340 and between the second electrodes 360 and the second substrate 380.

In this case, the first buffer layer 330 and the second buffer layer 370 may each include a silicone resin and an inorganic material, and the Young's modulus may be 1 to 65 MPa, preferably, 5 to 60 MPa, and more preferably, 10 to 50 MPa. In the specification, the Young's modulus may refer to the Young's modulus at 200° C. or less and, preferably, may refer to the Young's modulus at a temperature between 150° C. and 200° C. When the thermoelectric element is applied for power generation, power generation performance may increase as a temperature difference between the high-temperature part and the low-temperature part of the thermoelectric element increases. Accordingly, a temperature of the high-temperature part of the thermoelectric element may be 150° C. or higher, preferably, 180° C. or higher, and more preferably, 200° C. or higher. Accordingly, in the specification, a reference temperature which defines the Young's modulus of each of the first buffer layer 330 and the second buffer layer 370 may be a temperature between 150° C. and 200° C. When the Young's modulus of each of the first buffer layer 330 and the second buffer layer 370 satisfies this numerical range, since the buffer layer is elongated together even when the substrate is thermally expanded, the thermal stress between the substrate and the electrode may be minimized, and a problem in that cracks occur in the thermoelectric leg may be prevented. Here, the Young's modulus at each temperature may be measured with dynamic mechanical analysis (DMA) equipment, and in the embodiment, the Young's modulus for each temperature in a specimen of 10×23×0.05 mm was measured at a heating rate of 5° C./min and a frequency of 1 Hz using Rheometric Scientific DMA equipment having the model name RDA-700.

In this case, when the Young's modulus of each of the first buffer layer 330 and the second buffer layer 370 is smaller than 1 MPa, since the first buffer layer 330 and the second buffer layer 370 become difficult to support between the substrate and the electrode, reliability of the thermoelectric element may be easily weakened under a small external shock or vibration environment. On the other hand, when the Young's modulus of each of the first buffer layer 330 and the second buffer layer 370 exceeds 65 MPa, since the thermal stress between the substrate and the electrode increases, the possibility of an occurrence of the cracking at an interface in the thermoelectric element increases.

According to the embodiment of the present disclosure, the Young's modulus of the first buffer layer 330 may be different from the Young's modulus of the second buffer layer 370. For example, when the first substrate 310 is a low-temperature part and the second substrate 380 is a high-temperature part, that is, when a temperature at the first substrate 310 is lower than a temperature at the second substrate 380, the Young's modulus of the second buffer layer 370, which is a buffer layer of the high-temperature part, may be lower than the Young's modulus of the first buffer layer 330. Accordingly, even when the substrate at the high-temperature part side is thermally expanded, since the buffer layer may be elongated together, the thermal stress between the substrate and the electrode may be minimized, and a problem in that the crack occurs in the thermoelectric leg may be prevented.

In this case, the silicone resin included in the first buffer layer 330 and second buffer layer 370 may include polydimethylsiloxane (PDMS), and the inorganic material may include at least one of an oxide, carbide, and nitride of at least one of aluminum, titanium, zirconium, boron, and zinc. Here, a molecular weight of the PDMS may be 5,000 to 30,000 g/mol, and preferably, 15,000 to 30,000 g/mol. When the molecular weight of the PDMS satisfies this numerical range, since interchain bonding strength of the PDMS may be enhanced, the first buffer layer 330 and the second buffer layer 370 may each have the Young's modulus of 1 to 65 MPa, and preferably, 10 to 50 MPa. In this case, the first buffer layer 330 and the second buffer layer 370 may further include a crosslinking agent, and a molecular weight of the crosslinking agent may be 500 to 2000 g/mol, and preferably, 1,000 to 2,000 g/mol. As the molecular weight of the crosslinking agent increases, a chain length of the crosslinking agent increases, and accordingly, the first buffer layer 330 and the second buffer layer 370 may increase.

Meanwhile, the inorganic material may be included in an amount of 85 to 90 wt % in each of the first buffer layer 330 and the second buffer layer 370. In this case, the inorganic material may include a first inorganic material group in which D50 is 5 to 20 µm, a second inorganic material group in which D50 is 20 to 30 and a third inorganic material group in which D50 is 30 to 40 For example, the first inorganic material group may be included in an amount of 1 to 20 wt %, and preferably, 5 to 15 wt % of the total inorganic material, the second inorganic material group may be included in an amount of 10 to 30 wt %, and preferably, 15 to 25 wt % of the total inorganic material, and the third inorganic material group may be included in an amount of 60 to 80 wt %, and preferably, 65 to 75 wt % of the total inorganic material. In this case, in the inorganic material of the first buffer layer 330 and the second buffer layer 370, D50 may be 30 to 40 Like the above, when the inorganic material is included in an amount of 85 to 90 wt % of the first buffer layer 330 and the second buffer layer 370 and includes a plurality of inorganic material groups classified by particle sizes, since a heat dissipation path may be optimized, thermal conductivity of each of the first buffer layer 330 and the second buffer layer 370 may be increased to 2 W/mK or more, and preferably 3 W/mK or more.

Like the above, the first buffer layer 330 and the second buffer layer 370 according to the embodiment of the present disclosure may not only relieve thermal stress due to the difference in coefficient of thermal expansion between the substrate and the electrode but also enhance the insulating bonding strength and heat conduction performance between the substrate and the electrode.

In this case, each of the first buffer layer 330 and the second buffer layer 370 may have a thickness of 10 to 80 preferably, 20 to 60 and more preferably, 30 to 45 Here, it is advantageous in terms of the heat conduction performance that each of the first buffer layer 330 and the second buffer layer 370 is disposed as thin as possible while maintaining thermal stress relaxation performance, insulation performance, and adhesion performance. When the first substrate 310 is the low-temperature part and the second substrate 380 is the high-temperature part, since the second buffer layer 370 requires higher thermal stress relaxation performance, the thickness of the second buffer layer 370 may be thicker than the thickness of the buffer layer 330.

Meanwhile, as described above, assuming that the first substrate 310 is disposed at a low-temperature part side of the thermoelectric element 300 and the second substrate 380 is disposed at a high-temperature part side of the thermoelectric element 300, since an electric wire is connected to the first electrode 340, higher withstand voltage performance may be required at the low-temperature part side than at the high-temperature part side, and higher heat conduction performance may be required at the high-temperature part side.

Accordingly, according to the embodiment of the present disclosure, the first substrate 310 may be an aluminum substrate, and the second substrate 380 may be a copper substrate. The copper substrate has higher thermal conductivity and electrical conductivity than the aluminum substrate. Accordingly, when the first substrate 310 is made of the aluminum substrate and the second substrate 380 is made of the copper substrate, both high withstand voltage performance at the low-temperature part side and high heat dissipation performance at the high-temperature part side may be satisfied.

In order to increase the withstand voltage performance at the low-temperature part side, the first insulating layer 320 may be disposed between the first substrate 310 and the first buffer layer 330. The withstand voltage performance according to the embodiment of the present disclosure may refer to a characteristic which is maintained without insulation breakdown for 10 seconds under an alternating current (AC) voltage of 2.5 kV and a current of 1 mA. In the specification, the withstand voltage performance may be measured by a method of disposing an insulating layer on the substrate and then connecting one terminal to the substrate, and respectively connecting other terminals to 9 points of the insulating layer to test whether it is maintained without insulation breakdown during 10 seconds under an AC voltage of 2.5 kV and a current of 1 mA.

According to the embodiment of the present disclosure, the first insulating layer 320 may include aluminum oxide. Here, the first insulating layer 320 may be an aluminum oxide layer separately stacked on the first substrate 310 or may be an aluminum oxide layer oxidized by surface treatment of the first substrate 310, which is the aluminum substrate. For example, the aluminum oxide layer may be formed by anodizing the first substrate 310 which is the aluminum substrate or may be formed by a dipping process or a spray process.

According to another embodiment of the present disclosure, the first insulating layer 320 may include a composite including silicon and aluminum. Here, the composite may be at least one of oxide, carbide, and nitride including silicon and aluminum. For example, the composite may include at least one of an Al—Si bond, an Al—O—Si bond, an Si—O bond, an Al—Si—O bond, and an Al—O bond. Like the above, the composite including at least one of the Al—Si bond, the Al—O—Si bond, the Si—O bond, the Al—Si—O bond, and the Al—O bond may have excellent insulation performance, and accordingly, high withstand voltage performance may be obtained. Alternatively, the composite may be oxide, carbide, or nitride further including titanium, zirconium, boron, zinc, etc. along with silicon and aluminum. To this end, the composite may be obtained through a process of heat treatment after mixing at least one of an inorganic binder and an organic-inorganic mixed binder with aluminum. The inorganic binder may include at least one of silica ($SiO_2$), metal alkoxide, boron oxide ($B_2O_3$), and zinc oxide ($ZnO_2$), for example. The inorganic binder is inorganic particles, but may be sol or gel to serve as a binder when coming into contact with water. In this case, at least one of silica ($SiO_2$), metal alkoxide, and the boron oxide ($B_2O_3$) serves to increase adhesion between aluminum or with the first substrate 310, and zinc oxide ($ZnO_2$) may serve to increase strength of the first insulating layer 320 and increase the thermal conductivity.

Here, the composite may be included in an amount of 80 wt % or more, preferably, 85 wt % or more, and more preferably, 90 wt % or more of the entire first insulating layer 320.

In this case, a surface roughness Ra of 0.1 µm or more may be formed on the first insulating layer 320. The surface roughness may be formed when particles forming the composite protrude from the surface of the first insulating layer 320 and may be measured using a surface roughness meter. The surface roughness meter measures a cross-sectional curve using a probe and may calculate the surface roughness using a peak line, a valley bottom line, an average line, and a reference length of the cross-sectional curve. In this specification, the surface roughness may refer to arithmetic average roughness (Ra) by a center line average calculation method. The arithmetic average roughness (Ra) may be obtained through the following Equation 2.

$$R_a = \frac{1}{L}\int_0^L |f(x)|dx \qquad \text{Equation 2}$$

That is, when the cross-sectional curve obtained by the probe of the surface roughness meter is extracted by as much as a reference length L and expressed as a function (f(x)) with an average line direction set to an x-axis and a height direction set to a y-axis, the value obtained by Equation 2 may be expressed in micrometers.

Like the above, when the surface roughness Ra of the first insulating layer 320 is 0.1 µm or more, a contact area with the first buffer layer 330 increases, and accordingly, bonding strength with the first buffer layer 330 may increase. Specifically, as described above, when the first buffer layer 330 includes PDMS, since the PDMS of the first buffer layer 330 easily permeates between grooves formed by the surface roughness of the first insulating layer 320, the bonding strength between the first insulating layer 320 and the first buffer layer 330 may increase further.

In this case, the first insulating layer 320 may be formed on the first substrate 310 through a wet process. Here, the wet process may be a spray coating process, a dip coating process, a screen printing process, or the like. Accordingly, it is easy to control the thickness of the first insulating layer 320, and it is possible to apply a composite of various compositions.

In this case, the thickness of the first substrate 310 may be 0.1 to 2 mm, preferably, 0.3 to 1.5 mm, and more preferably, 0.5 to 1.2 mm, and the thickness of the first insulating layer 320 may be 10 to 100 µm, preferably, 20 to 80 µm, and more preferably, 30 to 60 µm. When the thickness of the first insulating layer 320 satisfies this numerical range, high heat conduction performance and high withstand voltage performance may be simultaneously satisfied.

Like the above, when the first insulating layer 320 and the first buffer layer 330 are disposed on the first substrate 310 and the first electrodes 340 are disposed on the first buffer layer 330, the withstand voltage performance at the low-temperature part side may be further improved compared to the case in which the first buffer layer 330 is not disposed. Specifically, when the first insulating layer 320 is an aluminum oxide layer formed by surface treatment of the first substrate 310, and the first buffer layer 330 is disposed on the first insulating layer 320, the withstand voltage performance may be increased while minimizing thermal resistance.

Referring to FIG. 6, when the first insulating layer 320 includes aluminum oxide, the first insulating layer 320 may be disposed on both surfaces of the first substrate 310. That is, an additional first insulating layer 322 may be disposed on the surface opposite the surface on which the first insulating layer 320 is disposed among both surfaces of the first substrate 310. Accordingly, the withstand voltage performance may be increased without increasing the thermal resistance of the first substrate 310, and the surface of the first substrate 310 may be prevented from corroding.

Alternatively, as shown in FIG. 7, when the first insulating layer 320 includes aluminum oxide, the first insulating layer 320 may also be disposed on side surfaces of the first substrate 310. That is, at least one of the first insulating layer 320 disposed on one side of the first substrate 310 and the first insulating layer 322 disposed on the other surface may form an extending portion 324 extending along the first substrate 310 so that the first insulating layer 320 and the first insulating layer 322 may be connected to each other at the side surfaces of the first substrate 310. Accordingly, the first insulating layer, for example, the aluminum oxide layer, may be formed on an entire surface of the first substrate 310, and it is possible to further increase the withstand voltage performance at the low-temperature part side. When the first substrate 310 is surface-treated to form the aluminum oxide layer, forming the aluminum oxide layer on both surfaces of the first substrate 310 as in the embodiment in FIG. 6 or forming the aluminum oxide layer on the entire surface of the first substrate 310 as in the embodiment in FIG. 7 is easy.

Meanwhile, as described above, the heat sink may be further disposed on the high-temperature part side. The second substrate 380 and the heat sink 390 at the high-temperature part side may be integrally formed, but a separate second substrate 380 and a separate heat sink 390 may be bonded to each other. In this case, when a metal oxide layer is formed on the second substrate 380, bonding between the second substrate 380 and the heat sink 390 may be difficult. Accordingly, in order to increase bonding strength between the second substrate 380 and the heat sink 390, the metal oxide layer may not be formed between the second substrate 380 and the heat sink 390. That is, when the second substrate 380 is a copper substrate, a copper oxide layer may not be formed on the surface of the copper substrate. To this end, the copper substrate may be surface-treated in advance to prevent oxidation of the copper substrate. For example, when the copper substrate is plated with a metal layer such as nickel having a property which is not easily oxidized compared to copper, it is possible to prevent the formation of the metal oxide layer on the copper substrate.

Meanwhile, according to yet another embodiment of the present disclosure, as shown in FIG. 8, a second insulating layer 375 which comes into contact with the second substrate 380 may be further disposed between the second buffer layer 370 and the second substrate 380.

In this case, a description of the second insulating layer 375 may be the same as the description of the above-described first insulating layer 320. That is, the second insulating layer 375 may be an aluminum oxide layer or a composite layer made of a composite including silicon and aluminum.

Alternatively, the second insulating layer 375 and the second buffer layer 370 may have the same composition.

Alternatively, the second insulating layer 375 may include a silicone resin and an inorganic material, have a composition different from that of the second buffer layer 370, and have the Young's modulus greater than that of the second buffer layer 370. For example, when the Young's modulus of the second buffer layer 370 is 1 to 65 MPa, the Young's modulus of the second insulating layer 375 may be 70 to 150 MPa. When the Young's modulus of the second insulating layer 375 satisfies this numerical range, mechanical rigidity between the second substrate 380 and the second electrode 360 may be maintained.

To this end, the silicone resin included in the second insulating layer 375 may have a lower molecular weight than the silicone resin included in the second buffer layer 370, a content of the silicone resin included in the second insulating layer 375 may be greater than a content of the silicone resin included in the second buffer layer 370, and a content of the inorganic material included in the second insulating layer 375 may be lower than a content of the inorganic material included in the second buffer layer 370. For example, the inorganic material may be included in an amount of 60 to 85 wt %, and preferably 80 to 85 wt % of the second insulating layer 375.

Meanwhile, the second buffer layer 370 may be formed by coating a composition in an uncured state or a semi-cured state on the second insulating layer 375 and then disposing and pressing a plurality of pre-aligned second electrodes 360. Accordingly, some of side surfaces of the plurality of second electrodes 360 may be buried in the second buffer layer 370. In this case, a height of each of the side surfaces of the plurality of second electrodes 360 buried in the second buffer layer 370 may be 0.1 to 1.0 times, preferably 0.2 to 0.9 times, and more preferably, 0.3 to 0.8 times the thickness of the plurality of second electrodes 360. Like the above, when some of the side surfaces of the plurality of second electrodes 360 are buried in the second buffer layer 370, a contact area between the plurality of second electrodes 360 and the second buffer layer 370 increases, and accordingly, heat transfer performance, bonding strength, and thermal stress relaxation performance between the plurality of second electrodes 360 and the second buffer layer 370 may be increased further.

More specifically, since the thickness of the second buffer layer 370 between the plurality of second electrodes 360 decreases from each electrode side surface toward a center region, vertices may have a smooth "V" shape.

Although not shown, according to yet another embodiment of the present disclosure, positions of the second buffer layer 370 and the second insulating layer 375 may be changed. For example, the second buffer layer 370 may be disposed to come into contact with the second substrate 380, the second insulating layer 375 may be disposed between the second buffer layer 370 and the second electrode 360, the Young's modulus of the second buffer layer 370 may be 1 to 65 MPa, and the Young's modulus of the second insulating layer 375 may be 70 to 150 MPa. Accordingly, the second buffer layer 370 may come into direct contact with the second substrate 380 and extend according to thermal expansion of the second substrate 380, and may serve to minimize thermal stress applied to the second electrode 360, and the second insulating layer 375 may come into direct contact with the plurality of second electrodes 360 and may serve to maintain insulation and mechanical strength.

Meanwhile, according to the embodiment of the present disclosure, the second substrate 380 and the heat sink 390 may be bonded by a separate fastening member.

Figure 9:
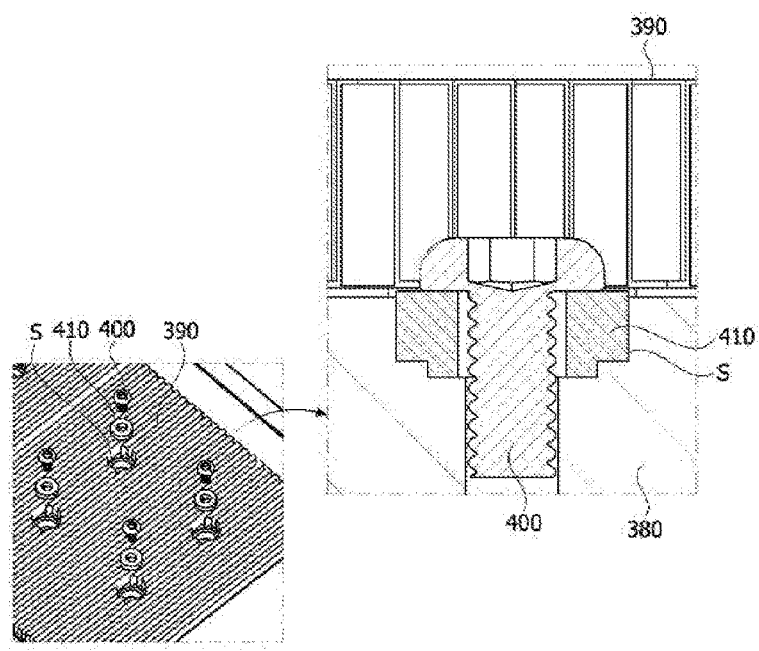
FIG. 9 exemplifies a bonding structure between a second substrate (380) and a heat sink (390)

FIG. 9 exemplifies a bonding structure between the second substrate 380 and the heat sink 390.

Referring to FIG. 9, the heat sink 390 and the second substrate 380 may be fastened by a plurality of fastening members 400. To this end, a through hole S through which the fastening members 400 pass may be formed in each of the heat sink 390 and the second substrate 380. Here, a separate insulator 410 may be further disposed between the through hole S and the fastening member 400. The separate insulator 410 may be an insulator surrounding an outer circumferential surface of the fastening member 400 or an insulator surrounding a wall surface of the through hole S. Accordingly, it is possible to increase an insulation distance of the thermoelectric element.

In this case, according to another embodiment of the present disclosure, a buffer layer of the same material as the second buffer layer 370 may also be disposed between the second substrate 380 and the heat sink 390. Accordingly, it is possible to prevent a problem in that the second substrate 380 and the heat sink 390 are partially spaced apart from each other due to a difference in coefficient of thermal expansion between the second substrate 380 and the heat sink 390.

Like the above, according to the embodiment of the present disclosure, a thermoelectric element having excellent thermoelectric performance and bonding performance may be obtained.

Hereinafter, effects according to the embodiments of the present disclosure will be described in more detail using Comparative Examples and Examples.

A buffer layer including PDMS and an inorganic material and having the Young's modulus of 25 MPa at 200° C. under the structure shown in FIG. 5 was applied to a thermoelectric element according to Example, a buffer layer including PDMS and an inorganic material and having the Young's modulus of 75 MPa at 200° C. in the structure shown in FIG. 5 was applied to a thermoelectric element according to Comparative Example 1, and the buffer layer was replaced with a polyimide layer in the structure shown in FIG. 5 in a thermoelectric element according to Comparative Example 2. More specifically, a molecular weight of the PDMS included in the buffer layer applied to the thermoelectric element according to Example is 15,000 to 30,000 g/mol, a content of the inorganic material in the buffer layer is 85 to 90 wt %, a molecular weight of the PDMS included in the buffer layer applied to the thermoelectric element according to Comparative Example 1 is 5,000 to 15,000 g/mol, and a content of the inorganic material in the buffer layer is 80 to 85 wt %.

Figure 10:
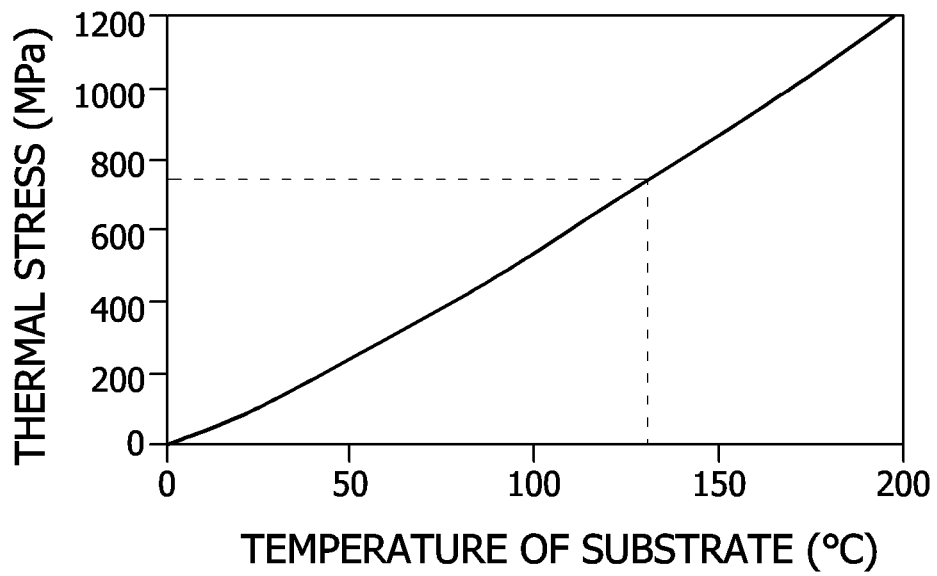
FIG. 10 is a graph illustrating a relationship between a temperature and thermal stress of a substrate in a thermoelectric element according to Comparative Example 1.

FIG. 10 is a graph illustrating a relationship between the temperature and thermal stress of a substrate in a thermoelectric element according to Comparative Example 1. First, in the thermoelectric element according to Comparative Example 1, when a temperature of the substrate was 145° C., an occurrence of interface breakdown between the substrate and the electrode was observed. Accordingly, as a result of evaluating the thermal stress with respect to the temperature of the substrate in the thermoelectric element according to Comparative Example 1, the thermal stress was observed to be 670 MPa when the temperature of the substrate was about 145° C. Accordingly, it was known that critical fracture stress of the thermoelectric element is 670 MPa.

Meanwhile, as a result of testing the correlation between elastic modulus of the buffer layer and the thermal stress between the substrate and the electrode, results in Table 1 were obtained.

TABLE 1

| Elastic modulus (MPa) | Thermal stress (MPa) |
| --- | --- |
| 3 | 250 |
| 65 | 660 |
| 100 | 900 |
| 200 | 1,150 |
| 300 | 1,450 |
| 1,000 | 2,850 |

That is, it was known that the thermal stress becomes low as the elastic modulus of the buffer layer becomes low. Specifically, when the elastic modulus was 65 MPa or less, it was known that the thermal stress is 660 MPa which is lower than the critical fracture stress.

Meanwhile, in order to increase power generation performance of the thermoelectric element applied to a power generation device, it is preferable that the interface between the electrode and the substrate does not break for 500 hours, and a resistance change rate is maintained within 7%, preferably, within 6%, and more preferably, within 5% under a condition in which the temperature of the high-temperature part of the thermoelectric element is 150° C. to 200° C., and a temperature of the low-temperature part is 15° C. to 55° C., that is, a temperature difference between the high-temperature part and the low-temperature part is 95° C. to 185° C., and even when the thermoelectric element is exposed to a high temperature for a long time, it is preferable that a Young's modulus change rate is maintained within 10%, preferably, within 7%, and more preferably, within 5%.

Figure 11:
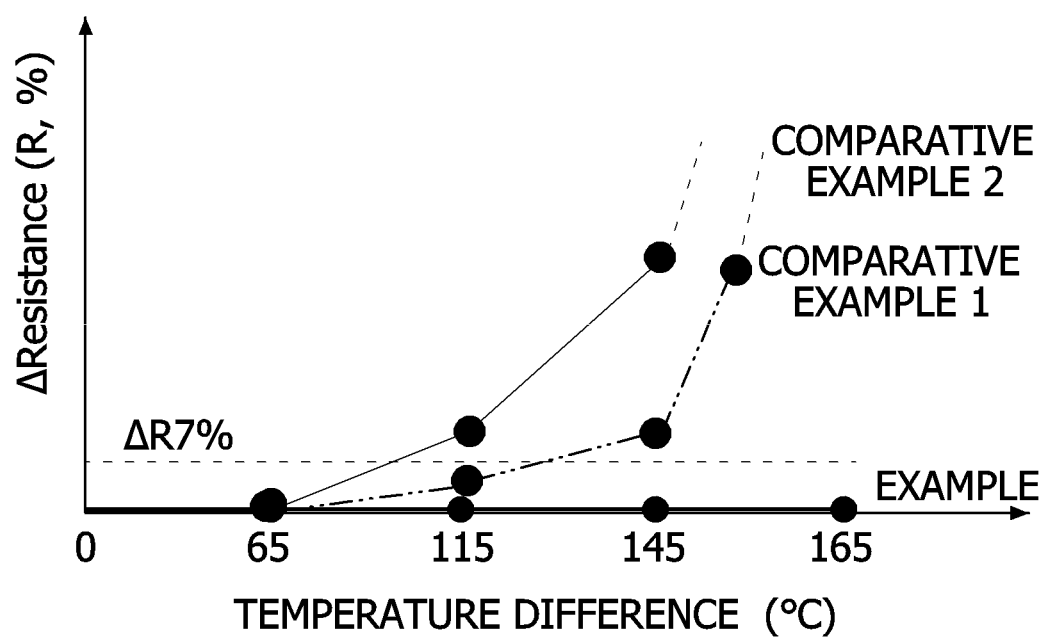
FIG. 11 is a graph measuring resistance change rates according to temperature differences between high-temperature parts and low-temperature parts of thermoelectric elements according to Example and Comparative Examples.
Figure 12:
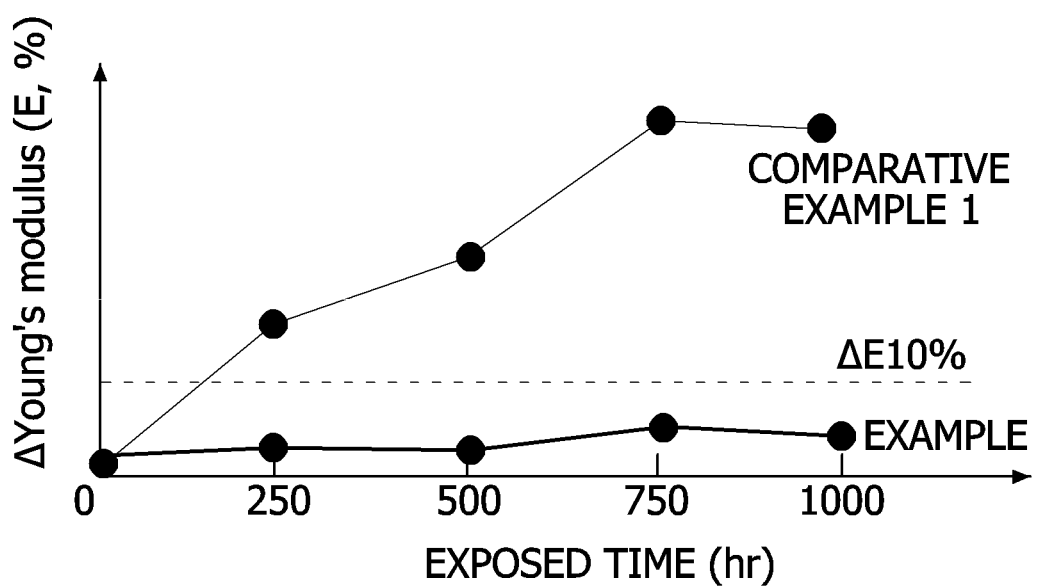
FIG. 12 is a graph measuring changes in Young's modulus according to times in which the thermoelectric elements according to Example and Comparative Example are exposed at 200° C.

FIG. 11 is a graph measuring resistance change rates according to temperature differences between high-temperature parts and low-temperature parts of the thermoelectric elements according to Example and Comparative Examples, and FIG. 12 is a graph measuring changes in Young's modulus according to times in which the thermoelectric elements according to Example and Comparative Examples are exposed at 200° C.

Referring to FIG. 11, in Example, even when the temperature difference between the high-temperature part and the low-temperature part of the thermoelectric element was 145° C. or more, the resistance change rate was maintained within 7%, but in Comparative Examples 1 and 2, the resistance change rate exceeded 7% even when the temperature difference between the high-temperature part and the low-temperature part of the thermoelectric element was lower than 145° C., and the resistance change rate due to thermal stress rapidly increased when the temperature difference between the high-temperature part and the low-temperature part was 145° C. or higher, and thus connection was disconnected.

Referring to FIG. 12, the Young's modulus change rate was maintained within a range of 10% even when the buffer layer according to Example was exposed at 150° C. to 200° C. for a long time, but it can be seen that the Young's modulus of the buffer layer according to Comparative Example 1 rapidly increased over 10% as an exposed time at roughly 200° C. increased.

Accordingly, in the thermoelectric element according to the embodiment of the present disclosure, since the interface between the electrode and the substrate does not break, the resistance change rate is maintained within 7% even under the condition in which the temperature of the high-temperature part is roughly 200° C., and the Young's modulus change rate is maintained within 10% even when the thermoelectric element is exposed for a long time at roughly 200° C., it may be known that the thermoelectric element has high reliability.

The thermoelectric element according to the embodiment of the present disclosure may be applied to a power generation system which generates electricity using the temperature difference between the high-temperature part and the low-temperature part. For example, a first fluid flows toward the first substrate of the thermoelectric element, that is, the low-temperature part, and a second fluid having a temperature higher than that of the first fluid flows toward the second substrate, that is, the high-temperature part, and accordingly, a temperature difference between the first substrate and the second substrate may occur and the electricity may be generated. In this case, the temperature of the second fluid may be, for example, 95° C. to 185° C. higher than the temperature of the first fluid.

Although preferable embodiments of the present disclosure are described above, those skilled in the art may variously modify and change the present disclosure within the scope of the spirit and area of the present disclosure disclosed in the claims which will be described later.

We claim:

1. A thermoelectric element comprising:
a first substrate;
a first buffer layer disposed on the first substrate;
a first electrode disposed on the first buffer layer;
a P-type thermoelectric leg and an N-type thermoelectric leg disposed on the first electrode;
a second electrode disposed on the P-type thermoelectric leg and the N-type thermoelectric leg;
a second buffer layer disposed on the second electrode; and
a second substrate disposed on the second buffer layer,
wherein the first substrate is an aluminum substrate,
wherein the second substrate is a copper substrate,
wherein an aluminum oxide layer is disposed between the first substrate and the first buffer layer,
wherein the first buffer layer and the second buffer layer include a silicone resin and an inorganic material,
wherein a Young's modulus of the second buffer layer is less than a Young's modulus of the first buffer layer,
wherein a thickness of the second buffer layer is thicker than a thickness of the first buffer layer, and
wherein the Young's modulus of the second buffer layer is 1 to 65 MPa.

2. The thermoelectric element of claim 1, wherein a reference temperature at which the Young's modules of the first or second buffer layer is defined as a temperature between 150° C. and 200° C.

3. The thermoelectric element of claim 1, wherein:
the silicone resin includes polydimethylsiloxane (PDMS); and
the inorganic material is included in an amount of 85 to 90 wt % of at least one of the first buffer layer and the second buffer layer.

4. The thermoelectric element of claim 3, wherein a molecular weight of the PDMS is 5,000 to 30,000 g/mol.

5. The thermoelectric element of claim 3, wherein the inorganic material includes a first inorganic material group in which D50 is 5 to 20 μm, a second inorganic material group in which D50 is 20 to 30 μm, and a third inorganic material group in which D50 is 30 to 40 μm.

6. The thermoelectric element of claim 5, wherein the first inorganic material group is included in an amount of 1 to 20 wt % of the inorganic material, the second inorganic material group is included in an amount of 10 to 30 wt % of the inorganic material, and the third inorganic material group is included in an amount of 60 to 80 wt % of the inorganic material.

7. The thermoelectric element of claim 2, wherein a change rate of the Young's modulus of the first buffer layer for 500 hours at 150° C. to 200° C. is within 10%.

8. The thermoelectric element of claim 1, wherein a surface roughness Ra of the aluminum oxide layer is 0.1 μm or more.

9. The thermoelectric element of claim 1, comprising an insulating layer disposed between the second substrate and the second buffer layer,
wherein the insulating layer is selected from an aluminum oxide layer, a composite layer formed of a composite including silicon and aluminum, and a resin layer formed of a resin composition including at least one of an epoxy resin and a silicone resin and an inorganic material.

10. The thermoelectric element of claim 9, wherein some of a side surface of the second electrode is buried in the second buffer layer.

11. The thermoelectric element of claim 1, further-comprising a heat sink disposed on the second substrate.

12. A power generation system comprising:
the thermoelectric element of claim 1,
a first fluid flowing toward the first substrate of the thermoelectric element, and
a second fluid flowing toward the second substrate of the thermoelectric element and having a temperature 95° C. to 185° C. higher than a temperature of the first fluid,
wherein a resistance change rate of the thermoelectric element is within 7% for 500 hours.

* * * * *